United States Patent
Edart

(10) Patent No.: US 7,317,509 B2
(45) Date of Patent: *Jan. 8, 2008

(54) METHOD AND SYSTEM FOR AUTOMATED PROCESS CORRECTION USING MODEL PARAMETERS, AND LITHOGRAPHIC APPARATUS USING SUCH METHOD AND SYSTEM

(75) Inventor: Remi Daniel Marie Edart, Veldhoven (NL)

(73) Assignee: Asml Netherlands B.V., Veldhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 11/529,597

(22) Filed: Sep. 29, 2006

(65) Prior Publication Data

US 2007/0024833 A1    Feb. 1, 2007

Related U.S. Application Data

(63) Continuation of application No. 11/020,572, filed on Dec. 27, 2004, now Pat. No. 7,126,669.

(51) Int. Cl.
*G03B 27/52* (2006.01)
*G03B 27/42* (2006.01)
*G03B 27/32* (2006.01)

(52) U.S. Cl. ............... 355/55; 355/53; 355/77

(58) Field of Classification Search ............... 355/53, 355/55, 67, 77; 356/399–401; 250/548; 430/311
See application file for complete search history.

(56) References Cited

U.S. PATENT DOCUMENTS

| 5,243,377 | A | 9/1993 | Umatate et al. |
| 5,757,673 | A | 5/1998 | Osheiski et al. |
| 6,992,767 | B2 | 1/2006 | Matsumoto et al. |
| 7,126,669 | B2 * | 10/2006 | Edart ............... 355/55 |

* cited by examiner

*Primary Examiner*—Henry Hung Nguyen
(74) *Attorney, Agent, or Firm*—Pillsbury Winthrop Shaw Pittman LLP

(57) ABSTRACT

A method for aligning a substrate in a lithographic apparatus is presented. The substrate includes a plurality of alignment marks. The alignment marks have been defined by a second lithographic apparatus and are arranged to provide a substrate grid as a coordinate system that includes a first and a second direction, substantially perpendicular to the first direction. The method includes measuring a location and an orientation of the alignment marks to obtain alignment mark data; determining the substrate grid of the substrate from the alignment mark data by using a first substrate grid model with a first set of parameters; determining the substrate grid of the substrate from the alignment mark data by using a second substrate grid model with a second set of parameters, the second set of parameters including an ortho-scaling parameter in addition to the first set of parameters, and correcting machine-to-machine differences between the lithographic apparatus and the second lithographic apparatus with automated process control data based on the ortho-scaling parameter.

10 Claims, 5 Drawing Sheets

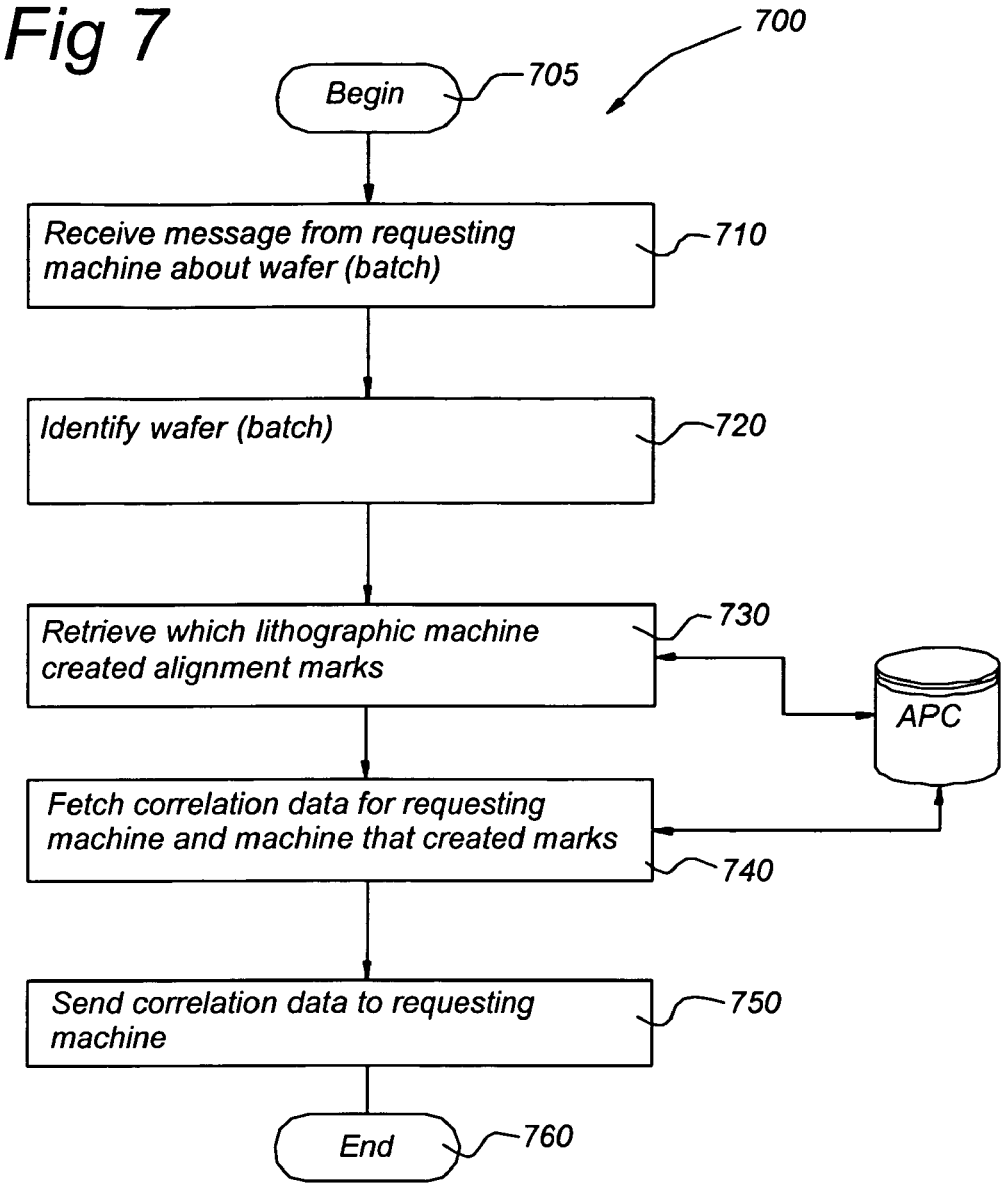

METHOD AND SYSTEM FOR AUTOMATED PROCESS CORRECTION USING MODEL PARAMETERS, AND LITHOGRAPHIC APPARATUS USING SUCH METHOD AND SYSTEM

CROSS-REFERENCE TO RELATED APPLICATIONS

This application is a continuation of U.S. application Ser. No. 11/020,572 filed Dec. 27, 2004 which is now U.S. Pat. No. 7,126,669, which is incorporated herein by reference in its entirety.

FIELD

The present invention relates to a method for alignment of a substrate on a substrate table. Also, the present invention relates to an automated process control method. Further, the present invention relates to a lithographic apparatus carrying out the method for alignment. Moreover, the present invention relates to a computer system in a lithographic apparatus. Furthermore, the present invention relates to a computer program in accordance with the method for alignment. Also, the present invention relates to a device manufacturing method arranged for use of the method for alignment. Moreover, the present invention relates to an automated process control system arranged for use of the method for alignment.

BACKGROUND

A lithographic apparatus is a machine that applies a desired pattern onto a substrate, usually onto a target portion of the substrate.

A lithographic apparatus can be used, for example, in the manufacture of integrated circuits (ICs). In that circumstance, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon substrate).

Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti parallel to this direction. It is also possible to transfer the pattern from the patterning device to the substrate by imprinting the pattern onto the substrate.

Typically, a plurality of patterned layers needs to be formed on top of each other to obtain a micro-electronic integrated circuit.

Alignment of the patterned layers relative to each other should be sufficiently accurate to ensure that features in subsequent patterned layers substantially fit onto (overlay) each other as designed.

Since the minimum feature sizes may be less than 100 nm, the overlay error (from one layer to a next layer) should be less than this minimal feature size.

To this end, the alignment of a substrate to a mask should be sufficiently accurate to obtain an exposure of the substrate to a pattern of the mask within the limits set by the design rules of the integrated circuit.

When only a single first lithographic apparatus is used for definition of each of the patterned layers, the alignment procedure as described above can provide for a sufficiently accurate alignment of all patterned layers. Only a suitable layer-to-layer alignment procedure is needed for minimizing the overlay error.

However, when using (at least) a second lithographic apparatus for next patterned layer, the overlay can be influenced by differences of substrate (chuck) alignment which may vary from one lithographic apparatus to another. Thus, a large machine-related overlay error may occur since an exposure field in the second lithographic apparatus may be shifted (and/or rotated) relative to the position of the field as used in the first lithographic apparatus.

Typically, the overlay error must be determined by using an off-line tool. The off-line tool determines the machine-related overlay error from overlay marks that are present in both the patterned layer exposed on the first lithographic apparatus, and the patterned layer exposed on the second lithographic apparatus. Such overlay marks are also known to persons skilled in the art as 'box-in-box' targets. Such an off-line analysis is troublesome since some time is needed for the off-line measurements. After a first substrate of a batch has been exposed in the second lithographic apparatus, the following substrates can only be exposed in the second lithographic apparatus after the overlay error on the first substrate is known and, the overlay error is compensated on the second lithographic apparatus. Thus, a batch can only be processed further after the overlay error has been determined (off-line). More advanced systems use historical data to determine expected overlay error and, hence, compensation.

Moreover, the accuracy of the overlay error is not high and only improves when the number of substrates being tested is increased. Simultaneously, the time needed for off-line inspection increases even further.

SUMMARY OF THE INVENTION

It is desirable to provide a method which can reduce or even avoid the need for an off-line procedure for overlay error correction between an exposure on a first lithographic apparatus and a subsequent exposure on a second lithographic apparatus.

According to an embodiment of the invention, there is provided a method for alignment of a substrate on a substrate table in a lithographic apparatus; the substrate including a plurality of alignment marks; the alignment marks having been defined by at least one further lithographic apparatus and being arranged for providing a substrate grid as a coordinate system on the substrate having a first direction and a second direction, the second direction being perpendicular to the first direction; the method including: measuring a location and an orientation of the alignment marks to obtain alignment mark data; determining the substrate grid of the substrate from the alignment mark data by using a first substrate grid model with a first set of parameters; determining the substrate grid of the substrate from the alignment mark data by using a second substrate grid model with a second set of parameters, the second set of parameters including at least one additional ortho-scaling parameter in excess of the first set of parameters; wherein the method provides a capability for carrying out an automated process control action for correction of machine-to-machine differences between the lithographic apparatus and the at least one further lithographic apparatus with automated process control data being based on data of the at least one additional ortho-scaling parameter.

Advantageously, the present invention provides a method that takes into account alignment and overlay differences between lithographic apparatus. The method can be executed on-line: i.e., the alignment and overlay differences may be determined within the lithographic apparatus during the normal optical alignment procedure of a substrate preceding an exposure run. Off-line time can effectively be reduced.

The term 'ortho-scaling parameter' is used here as a parameter in relation to machine-to machine differences between first and second lithographic apparatus, which differences include a rotational misalignment due to an orthogonal difference between machines and/or translational misalignment due to differences in scaling in the first direction and the second direction between machines.

According to an embodiment of the invention, there is provided a method for automated process control of a lithographic apparatus including the method of alignment of a substrate on a substrate table in the lithographic apparatus as described above.

According to an embodiment of the invention, there is provided a lithographic apparatus comprising a substrate table constructed to hold a substrate, the substrate comprising a plurality of alignment marks; the alignment marks having been defined by at least one further lithographic apparatus and being arranged for providing a substrate grid as a coordinate system on the substrate having a first direction and a second direction, the second direction being perpendicular to the first direction; and an alignment system arranged for alignment of the substrate along the substrate grid; the lithographic apparatus being arranged to: measure a location and an orientation of the alignment marks to obtain alignment mark data; determine the substrate grid of the substrate from the alignment mark data by using a first substrate grid model with a first set of parameters; determine the substrate grid of the substrate from the alignment mark data by using a second substrate grid model with a second set of parameters, the second set of parameters comprising at least one additional ortho-scaling parameter in excess of the first set of parameters, wherein the lithographic apparatus is provided with a capability for carrying out an automated process control action for correction of machine-to-machine differences between the lithographic apparatus and the at least one further lithographic apparatus with automated process control data being based on data of the at least one additional ortho-scaling parameter.

According to an embodiment of the invention, there is provided a computer system in a lithographic apparatus, the computer system including a processing unit, memory, the processing unit being connected to the memory; the lithographic apparatus being arranged to align a substrate on a substrate table in a lithographic apparatus; the substrate including a plurality of alignment marks; the alignment marks having been defined by a further lithographic apparatus and being arranged to provide a substrate grid as a coordinate system on the substrate having a first direction and a second direction, the second direction being perpendicular to the first direction; the computer system including a processing unit and memory, the memory being connected to the processing unit, the computer system being arranged to provide the lithographic apparatus with the capability for carrying out: measuring a location and an orientation of the alignment marks to obtain alignment mark data; determining the substrate grid of the substrate from the alignment mark data by using a first substrate grid model with a first set of parameters; determining the substrate grid of the substrate from the alignment mark data by using a second substrate grid model with a second set of parameters, the second set of parameters comprising at least one additional ortho-scaling parameter in excess of the first set of parameters, wherein the computer system provides the lithographic apparatus with a capability for carrying out an automated process control action for correction of machine-to-machine differences between the lithographic apparatus and the at least one further lithographic apparatus with automated process control data being based on data of the at least one additional ortho-scaling parameter.

According to an embodiment of the invention, there is provided a computer program to be loaded by a computer system of a lithographic apparatus, the computer system including processing unit, memory, the processing unit being connected to the memory; the computer program being arranged to align a substrate on a substrate table in the lithographic apparatus; the substrate including a plurality of alignment marks; the alignment marks having been defined by a further lithographic apparatus and being arranged to provide a substrate grid as a coordinate system on the substrate having a first direction and a second direction, the second direction being perpendicular to the first direction; the computer program after being loaded providing the lithographic apparatus with the capability for: measuring a location and an orientation of the alignment marks to obtain alignment mark data; determining the substrate grid of the substrate from the alignment mark data by using a first substrate grid model with a first set of parameters; determining the substrate grid of the substrate from the alignment mark data by using a second substrate grid model with a second set of parameters, the second set of parameters comprising at least one additional ortho-scaling parameter in excess of the first set of parameters, wherein the computer program provides the lithographic apparatus with a capability for carrying out an automated process control action for correction of machine-to-machine differences between the lithographic apparatus and the at least one further lithographic apparatus with automated process control data being based on data of the at least one additional ortho-scaling parameter.

According to an embodiment of the invention, there is provided a device manufacturing method including transferring a pattern from a patterning device onto a substrate, the transferring of the pattern including alignment of a substrate on a substrate table in a lithographic apparatus; the substrate including a plurality of alignment marks; the alignment marks having been defined by a further lithographic apparatus and the device manufacturing method being arranged to provide a substrate grid as a coordinate system on the substrate having a first direction and a second direction, the second direction being perpendicular to the first direction; the method including: measuring a location and an orientation of the alignment marks to obtain alignment mark data; determining the substrate grid of the substrate from the alignment mark data by using a first substrate grid model with a first set of parameters; determining the substrate grid of the substrate from the alignment mark data by using a second substrate grid model with a second set of parameters, the second set of parameters comprising at least one additional ortho-scaling parameter in excess of the first set of parameters, wherein the method provides a capability for carrying out an automated process control action for correction of machine-to-machine differences between the lithographic apparatus and the at least one further lithographic apparatus with automated process control data being based on data of the at least one additional ortho-scaling parameter.

Also, in a further embodiment of the invention, there is provided an automated process control system including a server, a lithographic apparatus and at least one further lithographic apparatus, the server including a fab host computer system, (i.e. a computer system that manages a fabrication facility equipped with lithographic apparatus); the lithographic apparatus and the at least one further lithographic apparatus each including a computer system, each computer system including a processing unit and memory, the memory being connected to the processing unit; the fab host computer system being connected to the computer system of the lithographic apparatus and to the computer system of the at least one further lithographic apparatus; the automated process control system being arranged for a method for alignment of a substrate on a substrate table in the lithographic apparatus as described above, wherein the automated process control system is arranged with the capability for carrying out an automated process control step for the lithographic apparatus for correction of machine-to-machine differences between the lithographic apparatus and the at least one further lithographic apparatus with automated process control data being based on data of the additional ortho-scaling parameters.

In an embodiment of the invention, there is provided a computer program to be loaded by a computer system of a first lithographic apparatus, the computer system including a processing unit, a memory, the processing unit being connected to the memory; the computer system being configured to align a substrate on a substrate table of the first lithographic apparatus; the substrate including a plurality of alignment marks that have been defined by a second lithographic apparatus and are arranged to provide a substrate grid as a coordinate system, the coordinate system including a first direction and a second direction, the second direction being substantially perpendicular to the first direction, said computer program including machine executable instructions executable by said computer system to perform the alignment of said substrate according to a method including: measuring a location and an orientation of the plurality of alignment marks to obtain alignment mark data; determining the substrate grid of the substrate from the alignment mark data by using a first substrate grid model with a first set of parameters; determining the substrate grid of the substrate from the alignment mark data by using a second substrate grid model with a second set of parameters, the second set of parameters comprising an ortho-scaling parameter in addition to the first set of parameters, and correcting machine-to-machine differences between the first lithographic apparatus and the second lithographic apparatus with automated process control data based on the ortho-scaling parameter.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 7 shows a second flow diagram in accordance with an embodiment of the present invention.

DETAILED DESCRIPTION

Figure 1:
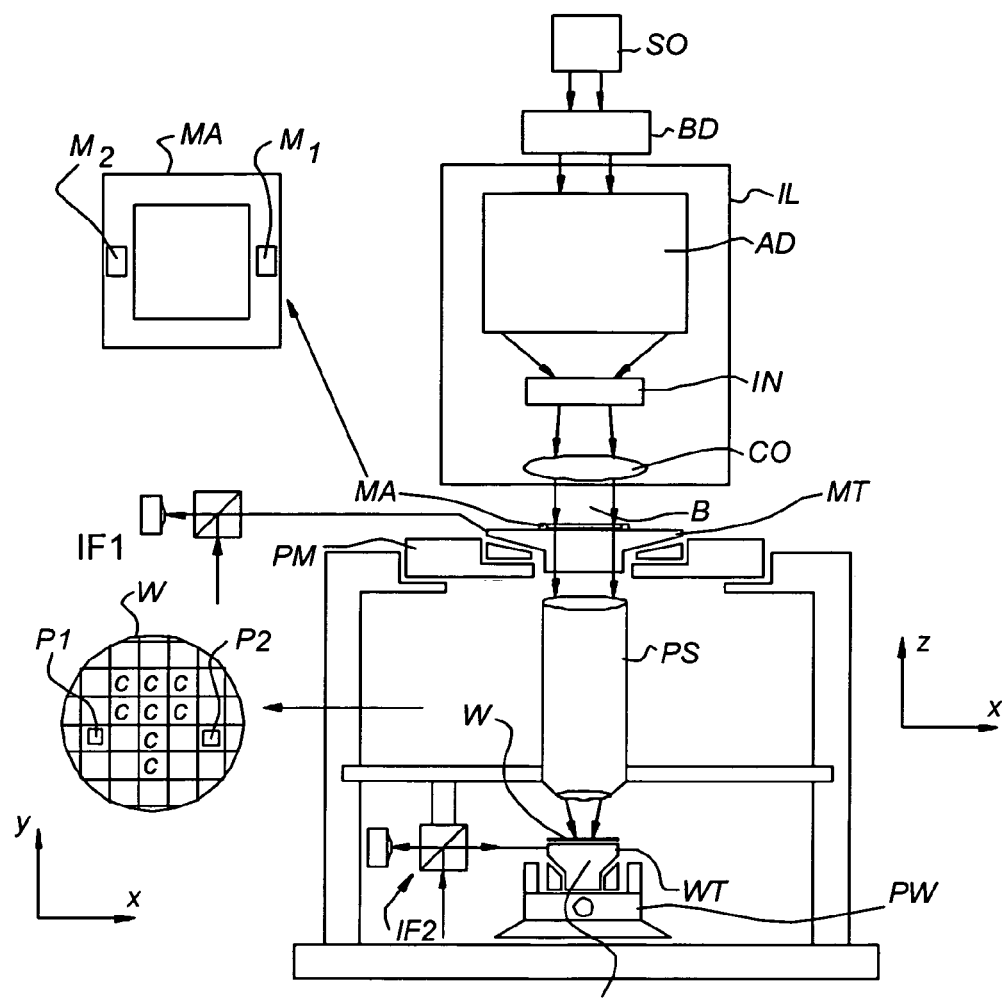
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation), and a support structure (e.g. a mask table) MT constructed to support a patterning device (e.g. a mask) MA and connected to a first positioner PM configured to accurately position the patterning device in accordance with certain parameters. The apparatus also includes a substrate table WT constructed to hold a substrate (e.g. a resist coated substrate) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross section.

The radiation beam B is incident on the patterning device (e.g., mask MA), which is held on the support structure (e.g., mask table MT), and is patterned by the patterning device.

Having traversed the mask MA, the radiation beam B passes through the projection system PS, which focuses the beam onto a target portion C of the substrate W. With the aid of the second positioner PW and position sensor IF2 (e.g. an interferometric device, linear encoder or capacitive sensor), the substrate table WT can be moved accurately, e.g. so as to position different target portions C in the path of the radiation beam B. Similarly, the first positioner PM and another position sensor IF1 can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these spaces are known as scribe-lanes, alignment marks located in them are known as scribe-lane alignment marks). Similarly, in situations in which more than one die is provided on the mask MA, the mask alignment marks may be located between the dies.

The depicted apparatus could be used in at least one of the following modes:

Step mode: the mask table MT and the substrate table WT are kept essentially stationary, while an entire pattern imparted to the radiation beam is projected onto a target portion C at once (i.e. a single static exposure). The substrate table WT is then shifted in the X and/or Y direction so that a different target portion C can be exposed. In step mode, the maximum size of the exposure field limits the size of the target portion C imaged in a single static exposure.

Scan mode: the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

Another mode: the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Note that the substrate table WT includes a reference marker (or fiducial point) which is used for calibrating the position and orientation of the substrate table within the reference frame of the lithographic apparatus.

Combinations and/or variations on the above described modes of use or entirely different modes of use may also be employed.

Figure 2:
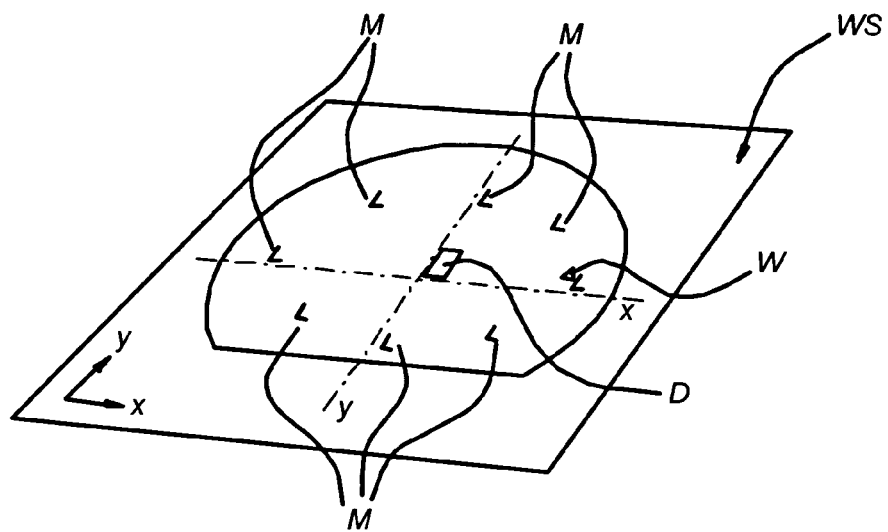
FIG. 2 depicts schematically a substrate including a plurality of marks as manufactured by a first lithographic apparatus.

FIG. 2 depicts schematically a substrate including a plurality of marks as manufactured by a first lithographic apparatus.

On the substrate table WT, a substrate W is positioned. On the substrate a plurality of (future) dies is arranged. The die D depicts the substrate estate needed for a single micro-electronic device on the substrate W. Within each die D a complete micro-electronic device will be formed during a series of lithographic processes. For clarity only one die D is shown.

Typically, to create a micro-electronic device, a plurality of patterned layers needs to be formed on top of each other to obtain such a micro-electronic integrated circuit.

The substrate W includes a plurality of marks M which are to be used for alignment and overlay control during successive lithographic processing steps.

The marks M are manufactured in a zero layer (the substrate surface) or a first layer by a first lithographic process carried out by a first lithographic apparatus.

If the marks M are made in the first layer, simultaneously a first layer portion of the micro-electronic device in each die D is formed.

The marks M are located at pre-determined locations on the substrate W, for example in the scribe-lanes in between dies D.

The use of such pre-determined locations of the marks M allows for the set-up of a substrate-based coordinate system or "wafer grid" as is known to persons skilled in the art.

The purpose of the substrate grid is to have a reference in each subsequent lithographic process for the creation of a next layer portion of the micro-electronic device in the still embryonic state.

In each subsequent lithographic process carried out by a lithographic apparatus, the orientation of the substrate W (i.e., the substrate grid) is determined based on the positions of the marks M. The positions of the marks M are measured by a mark detection system that is capable of determining a position of a mark M on the substrate W by for example optically measuring diffracted light produced by diffraction of a light beam on that mark M. A precise description of this mark detection system is omitted here: various methods for measurement and analysis of the position of marks are available as known to persons skilled in the art.

On the substrate W, a first direction X and a second direction Y are indicated by dashed lines X and Y respectively. The first and second directions X, Y indicate the translation axes along which the die D is translated and repeated to substantially fill the substrate W with equal dies D. The translational directions X, Y are defined by a first lithographic process which defines the area for each alignment mark and/or die D on the substrate W.

Figure 3:
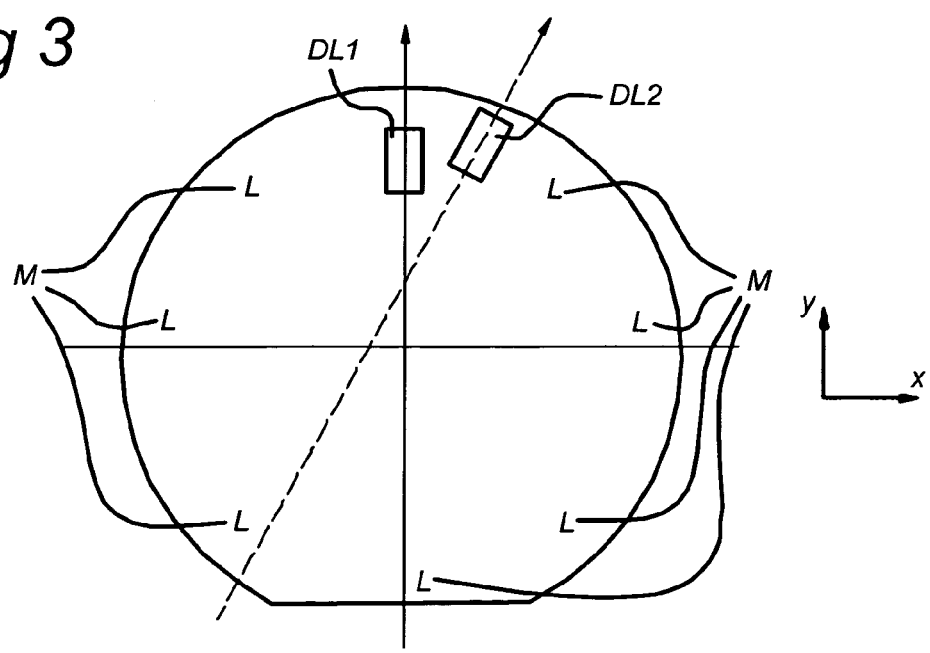
FIG. 3 depicts schematically the substrate including a plurality of marks made on the first lithographic apparatus as observed in a second lithographic apparatus.

FIG. 3 depicts schematically the substrate W including a plurality of marks M made on the first lithographic apparatus as observed in a second lithographic apparatus.

After a lithographic process step, the substrate W is removed from the lithographic apparatus and processed further as required. Then, a second or further lithographic process step is to be carried out after that preceding lithographic process step, and the substrate W is placed again in the lithographic apparatus. Before exposure of the surface, the substrate W needs to be aligned in such a way that a sufficient overlay of the pattern to be made and the pattern already present from the preceding lithographic step is obtained.

In FIG. 3 the pattern on the substrate W and the pattern to be made are schematically shown. A portion of a die in the first pattern layer DL1 (first die portion) is depicted by a rectangle (solid lines). The first pattern layer DL1 has been fabricated on the first lithographic apparatus. A portion of the same die in a second pattern layer DL2 (second die portion) is depicted by the second rectangle DL2 on the dashed arrow line. The second pattern layer DL2 is to be fabricated by a second lithographic apparatus.

The second pattern layer DL2 has been aligned using the normal alignment procedure. However, due to machine-related differences (i.e., optical, and (electro-)mechanical) between the first and second lithographic apparatus, the respective exposure procedures are not identical. For example, the pattern in the second pattern layer DL2 is shifted and rotated relative to the pattern in the first pattern layer DL1.

For clarity of the illustration the shift and rotation have been exaggerated by projecting second die portion DL2 substantially outside of the area of first die portion DL1. Normally, the misalignment would be such that DL1 and DL2 still display overlap. Nevertheless, the machine-to-machine differences cause a misalignment between first and second die portions DL1 and DL2, by translation as well as rotation.

Conventionally, to correct such deviations a sample exposure on the second lithographic apparatus is done for one or more test substrates which have been previously exposed on the first lithographic apparatus. Then, for each test substrate, after development of the second pattern portion, the overlay of second and first pattern portions is determined, e.g., by a box-in-box overlay marker (not shown) in an off-line mode. From overlay measurements, a correction is derived for the second lithographic apparatus to have a better overlay of the pattern in the second pattern layer DL2 with the pattern in the first pattern layer DL1 manufactured on the first lithographic apparatus. Note that the overlay correction is a pattern-to-pattern correction.

However, the conventional procedure involves off-line analysis which may slow down the manufacturing process since some time is needed for the off-line measurements. After a first substrate of a batch has been exposed in the second lithographic apparatus, the following substrates can only exposed in the second lithographic apparatus after the overlay error on the first substrate is known and, the overlay error is compensated on the second lithographic apparatus. Thus, a batch can only be processed further after the overlay error has been determined off-line. Additionally, the accuracy of the overlay error as determined by off-line analysis is not high.

The method of the present invention allows to reduce off-line measurement machine time since it is possible in respect of the machine-to-machine differences of orthogonality and scaling to rely on the alignment data to determine process corrections relating to the orthogonality and scaling. In the present invention, a correction is determined in an on-line mode, i.e., while the substrate to be processed is on the substrate table WT of the second lithographic apparatus. The correction can be applied directly to the substrate, without a need for off-line measurements on one or more test substrates. Basically, the use of test substrates can be omitted for this purpose. Moreover, the correction provided can be used as a machine-to-machine correction as explained below.

Previously, a first lithographic apparatus was used to print a pattern for alignment marks M on the substrate W. By processing as known in the art, the pattern has been developed and transferred into the substrate W (either zero layer or first layer). Upon loading on the substrate table WT of the second lithographic apparatus, the substrate W is usually positioned by a pre-alignment step and an alignment step.

In the alignment step, the alignment marks M are measured by the optical alignment system. The optical alignment system includes an illumination source which illuminates the alignment marks M on the substrate W (on the substrate table WT), and one or more optical sensors which detect optical signals from the alignment marks M. Each alignment mark M generates an optical signal in response to the illumination by the illumination source. The one or more optical sensors collect the optical signals from the alignment marks M as alignment mark data. Note that during these measurements the substrate table WT is subjected to a series of movements basically along its X- and Y-direction.

Next, in order to retrieve the position and orientation of the substrate W on the substrate table WT, the alignment mark data are processed by solving a set of equations of a wafer grid model.

Note that within the frame of the lithographic apparatus the position and orientation of the substrate table WT on which the substrate W is mounted is known from the reference marker or fiducial point on the substrate table WT.

Various substrate grid models exist for determining the position and orientation of the substrate W: models based on 4, 5 or 6 parameters are well known.

For example, the 4-parameter (4-p) model describes the position and orientation relative to a reference position of the substrate table WT using: a translation Tx in X direction, a translation Ty in a perpendicular Y direction, a rotation angle R around the reference position of the substrate table WT and an overall scaling factor S.

The 5- or 6-parameter (5-p, 6-p) models are similar, except that the 5-parameter model provides a scaling factor Sx in X-direction and a scaling factor Sy in Y-direction instead of a single overall scaling factor S. Also, the 5-parameter model may include the same parameters as the 4-p model plus a orthogonality factor OG as fifth parameter. Thus, depending on the implementation the 5-p model provides the parameters Tx, Ty, R, S and OG, or Tx, Ty, R, Sx and Sy.

The orthogonality factor OG indicates the non-orthogonality between the present pattern made on the first lithographic apparatus through first pattern layer DL1 and the pattern to be made by the second lithographic apparatus through the second pattern layer DL2.

The 6-parameter model provides in addition to the parameters of the 4-p model, both scaling factors Sx in X-direction and Sy in Y-direction, respectively, and the orthogonality factor OG, thus the parameters Tx, Ty, R, Sx, Sy and OG.

In the present invention, calculations on the alignment mark data with the 4-parameter model are used to determine the wafer grid and to align the substrate W accordingly. Then, further calculations on the alignment mark data are performed using the 5- or 6-parameter model. Using the same data, the parameters obtained from the 4-parameter model include a higher accuracy than the parameters from the 5- or 6-parameter model, as known to the skilled person. As will be explained below, statistical methods can improve the accuracy of the additional parameter values (OG and/or Sx and Sy) determined by the 5-p or 6-p models.

The 5-p and 6-p models include additional parameters in addition to the parameters of the 4-p model, (in the following the additional parameters will be referred to as ortho-scaling parameters), in particular the orthogonality OG and/or scaling Sx and Sy factor(s) are indicative of the optical and (electro-)mechanical differences between the first and the second lithographic apparatus (i.e. machine-to-machine differences caused by optical and/or electromechanical differences between the machines).

The term 'ortho-scaling parameter' is used here as a parameter in relation to machine-to machine differences between first and second lithographic apparatus, which differences include a rotational misalignment due to an orthogonality difference between machines and/or translational misalignment due to differences in scaling in the first direction and the second direction between machines.

Thus, the term 'ortho-scaling parameter' relates to the orthogonality factor OG which is related to a rotational misalignment between the first and second lithographic apparatus, and to the scaling factors in X- and Y-direction, Sx and Sy respectively, (which strictly does not cause a change in orthogonality) may be included in the term 'ortho-scaling' as used here.

Due to the linkage of the substrate grid with the fiducial point on the substrate table WT for each machine, determining the substrate grid on a machine (i.e., using it as a reference) allows for corrections between the various lithographic machines used for processing.

The ortho-scaling parameters OG, and/or Sx and Sy obtained by the 5- or 6-parameter model (additional to the 4 parameters determined by the 4-parameter model) are stored as statistical data to describe the machine-to-machine differences for two lithographic apparatus, i.e., between the first lithographic apparatus and the second lithographic apparatus.

Each substrate W that is aligned for exposure in a lithographic process in any lithographic apparatus of a production facility (for example a "wafer fab") can be used for collecting data on the additional parameters with respect to differences between that particular lithographic apparatus and the lithographic apparatus in which the substrate grid was first defined by creation of the alignment marks M. This will be illustrated with reference to FIG. 5.

Especially, since lithographic processing typically involves the use of many substrates W, statistical analysis of the stored ortho-scaling parameters OG and/or Sx and Sy for each measured substrate and for each machine can be used in a process control step for correction of the alignment of the second lithographic apparatus to compensate its optical and (electro-)mechanical differences with respect to the first lithographic apparatus.

Although the accuracy of the data from a 6-parameter model is less than that of a 4-parameter model, the (typically large) number of substrates being processed allows that statistically significant data can be obtained.

Before explaining FIG. 5 in detail, a computer system which can be used as a server in the arrangement of FIG. 5 will be explained.

Figure 4:
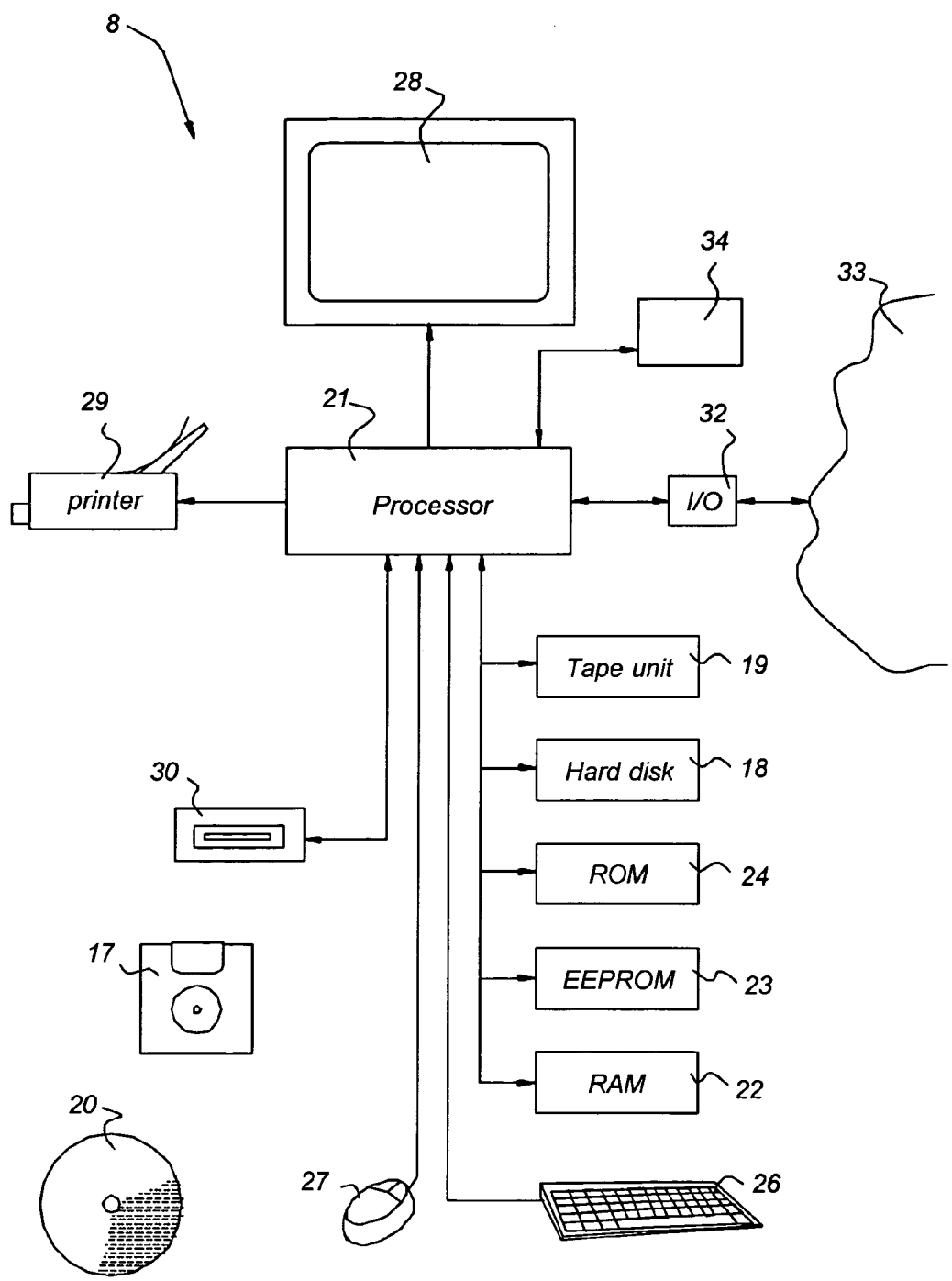
FIG. 4 shows schematically a computer system for use in accordance with an embodiment of the present invention.

FIG. 4 shows schematically such a computer system 8.

Computer system 8 includes host processor 21 with peripherals. The host processor 21 is connected to one or more memory units 18, 19, 22, 23, 24 which store instructions and data, one or more reading units 30 (to read, e.g., floppy disks 17, CD ROM's or DVD's 20, etc.), a keyboard 26 and a mouse 27 as input devices, and as output devices, a monitor 28 and a printer 29. Other input devices, like a trackball, a touch screen or a scanner, as well as other output devices may be provided.

The memory units shown include RAM 22, (E)EPROM 23, ROM 24, tape unit 19, and hard disk 18. However, it should be understood that there may be provided more and/or other memory units known to persons skilled in the art. Additionally, one or more of them may be physically located remote from the processor 21, if needed.

The processor 21 is shown as one box, however, it may include several processing units functioning in parallel or controlled by one main processor. The processing units may be located remotely from one another, as is known to persons skilled in the art, for example in a network topology.

The computer system 8 is connected to the optical alignment system 34 of a lithographic apparatus. The connection between the computer system 8 and the optical alignment system 34 may be direct or arranged over a network (not shown). In case of a connection over a network, the network may be a local area network, and also may include telecommunication networks. The connection of the computer system 8 to the optical alignment system 34 may be embodied in any way known to persons skilled in the art, e.g., by wire or wireless.

The processor 21 of computer arrangement 8 is capable of executing software code that implements the method of the present invention.

The computer system 8 shown in FIG. 4 is arranged to perform the steps of the method of the present invention as described above: i.e., it controls the scanning procedure of the alignment marks M, it is capable of recording optical signals measured on the alignment marks M on the substrate W as a function of the position and orientation of the substrate table WT, and it can carry out the data processing on the data collected by the measurements, i.e., calculate the 4-p model parameters Tx, Ty, R, S, and depending on the implementation, the 5-p model parameters Tx, Ty, R, S, OG or Tx, Ty, R, Sx, Sy and/or the 6-p model parameters Tx, Ty, R, Sx, Sy, OG.

Further, the computer system 8 is arranged to send information on at least the ortho-scaling parameters OG and/or Sx and Sy as determined for the particular lithographic apparatus to a central database e.g., stored on hard disk 18. As will be described in more detail below, the central database may be used for process control purposes.

Figure 5:
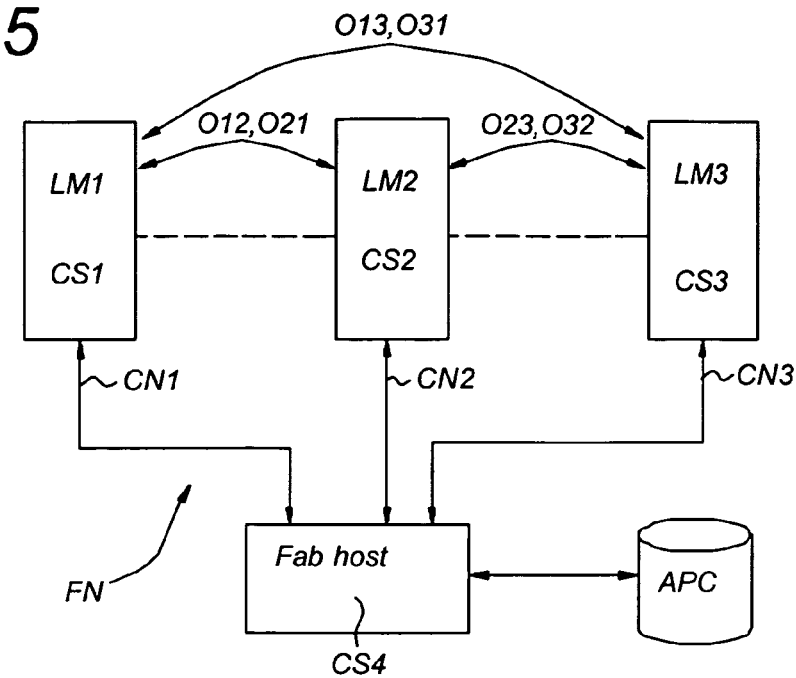
FIG. 5 shows diagrammatically a network of lithographic apparatus and a server computer in accordance with an embodiment of the present invention.

FIG. 5 shows diagrammatically a network of lithographic apparatus LM1, LM2, LM3 and a server computer Fab Host in accordance with the present invention.

In a fab network FN within a wafer fab (i.e. a fabrication facility equipped with lithographic apparatus), a plurality of lithographic apparatus LM1, LM2, LM3 are arranged in a communication network which is served by a server Fab Host. The server Fab Host is typically a so-called server computer system CS4 as known to the skilled person. This fab host server is arranged to manage equipment in the fabrication facility. Such equipment typically includes a computer for controlling functions of the equipment. Among this equipment the fabrication facility comprises lithographic apparatus.

Such a fab host server computer system CS4 includes one or more processors and memory in connection to the processor(s) as explained with reference to FIG. 4. Further, the server Fab Host includes network connections for communication with other computers or controllers.

In this example, three (first, second and third) lithographic apparatus LM1, LM2, LM3 are depicted but the wafer fab may include any other number of lithographic apparatus. The lithographic apparatus LM1, LM2, LM3 (using a computer system CS1; CS2; CS3 within the respective lithographic apparatus) are connected to the fab host by connections CN1, CN2, CN3. Here, the symbolical links CN1, CN2, CN3 are shown: the precise topography of the fab network FN is not relevant.

The server Fab Host is connected to a database APC for automatic process control. The database APC contains information on automatic process control for the lithographic apparatus LM1, LM2, LM3, as will be explained below.

A statistical correlation of the machine-to-machine differences of an optical and/or (electro-) mechanical nature between first LM1 and second lithographic apparatus LM2 is depicted by a double arrow O12, O21 between lithographic apparatus LM1 and LM2. Between second and third lithographic apparatus LM2, LM3 a statistical correlation of the machine-to-machine differences is depicted by O23, O32, and between first and third lithographic apparatus LM1, LM3 a statistical correlation of the machine-to-machine differences is depicted by O13, O31. O21 is the reverse correlation of O12, O32 the reverse of O23, and O31 the reverse of O13. These statistical correlations will be described in more detail below with reference to FIGS. 6 and 7.

Note that in the fab network FN other machines (not shown) can be used for processing substrates such as furnaces, ion implanters, deposition machines, dry-etch reactors, wafer tracks, inspection machines, etc, and they may also be connected to the server Fab Host and communicate with the server Fab Host for use of information stored in the database APC, including information on ortho-scaling parameters.

It is noted that each lithographic apparatus LM1; LM2; LM3 is equipped with a computer system CS1; CS2; CS3 which may be similar to the computer system 8 as explained with reference to FIG. 4.

Figure 6:
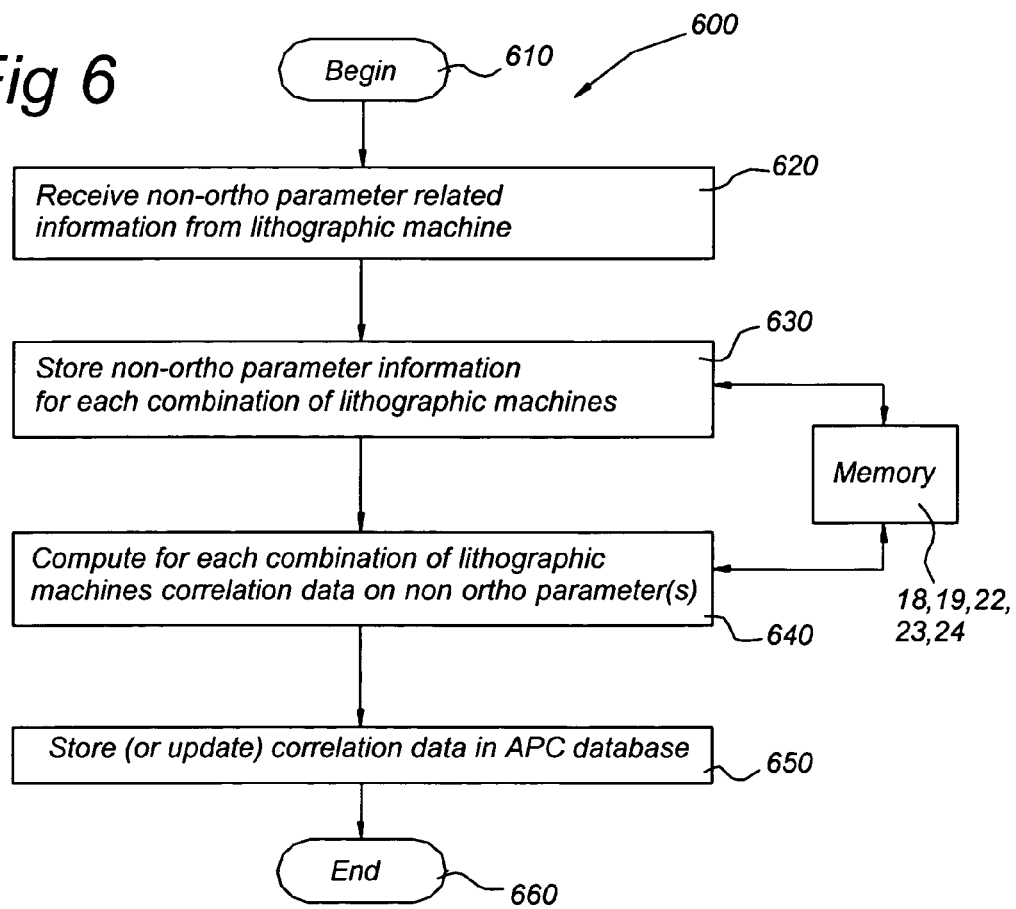
FIG. 6 shows a first flow diagram in accordance with an embodiment of the present invention.

FIG. 6 shows a first flow diagram in accordance with the present invention.

The first flow diagram shows a procedure 600 for collection of statistical correlation data by the fab host. The fab host is arranged to record information it receives from the computer system CS1; CS2; CS3 of each lithographic apparatus LM1; LM2; LM3, relating to at least the ortho-scaling parameters for each substrate W that is processed on the respective lithographic apparatus.

Note that such information on ortho-scaling parameters may include results computed from the 4 parameter model and from the 6 parameter model as discussed above, for example only the ortho-scaling parameters. Also, it is conceivable that raw alignment data i.e., data as obtained by the optical alignment system of the respective lithographic apparatus without processing according to the 4-p or 6-p model, is transmitted from the lithographic apparatus to the fab host. In the latter case the data of the 4 parameter substrate model and 6 parameter substrate model are to be computed by the fab host.

In a first step 610, some initializations may be performed by the processor of the fab host.

In a next step 620, the fab host receives information from a lithographic apparatus LM1; LM2; LM3 relating to at least the ortho-scaling parameters for each substrate W that is processed on the respective lithographic apparatus. Also, information on the lithographic apparatus LM1; LM2; LM3 that created the alignment marks M is received from the lithographic apparatus.

Next in step 630, the fab host stores in its memory the information on ortho-scaling parameters for each lithographic apparatus separately in combination with the information on the lithographic apparatus LM1; LM2; LM3 that created the alignment marks M.

In a further step 640, the fab host retrieves from the memory stored information on ortho-scaling parameters OG; Sx, Sy; OG, Sx, Sy derived by a given lithographic apparatus for a particular lithographic apparatus that created the alignment marks. Next, the fab host computer system CS4 computes statistical correlations between that specific lithographic apparatus and the lithographic apparatus which created the alignment marks M. These statistical correlations include for example, data relating to an average, or a median value and/or a variance of each of one or more ortho-scaling parameter(s), depending on the actual implementation. Other types of statistical data may be used as well as will be appreciated by persons skilled in the art.

These computations on statistical correlations are performed for each possible combination of lithographic apparatus LM1, LM2, LM3 within the fab.

Then, in step 650, when sufficient data has been collected, the statistical correlations are entered in the database APC (or used to update the database APC).

In step 660, the procedure ends.

The database APC includes statistical correlations O12, O21, O23, O32, O13, O31 for the machine-to-machine differences (in the form of ortho-scaling parameters information) between each combination of lithographic apparatus LM1, LM2, LM3.

It is noted that for establishing a statistical correlation between two lithographic apparatus LM1, LM2, LM3, it is not necessary that the processes on the lithographic apparatus are performed in a direct succession. Other processes may have performed in between the process of the first used lithographic apparatus e.g., LM1 and the process on the other of the two lithographic apparatus e.g., LM2 or LM3.

Note that the data O12, O21, O13, O31, O23, O32 for statistical correlation can in principle be used in a two way direction: either one of the lithographic apparatus LM1, LM2, LM3 could have been used to create the alignment marks M.

It is also conceivable that the statistical correlation O12, O21, O13, O31, O23, O32 can not simply be reversed. In that case, for example statistical correlation O12 between first lithographic apparatus and second lithographic apparatus LM2 with first lithographic apparatus as creator of the alignment marks M must be distinguished from the reverse statistical correlation O21 between first lithographic apparatus and second lithographic apparatus LM2 with second lithographic apparatus LM2 as creator of the alignment marks M.

Thus, in this example, database APC includes data for statistical correlation between three lithographic apparatus: O12, O21, O13, O31, O23 and O32. Depending on the possible reversibility of the order for using the respective machines, statistical correlations O12 and O21, O13 and O31, and O23 and O32, respectively, may include identical statistical correlations or not. (O13=O31, O12=O21, and O23=O32 in case the order is reversible).

In FIG. 7 a method for the server Fab Host to use the statistical correlation data O12, O21, O13, O31, O23 and O32 between lithographic apparatus LM1, LM2, LM3 is described.

FIG. 7 shows a second flow diagram in accordance with an embodiment of the present invention.

The process control program in accordance with the present invention may be implemented on the server Fab Host as shown in procedure 700.

For example, in second lithographic apparatus LM2 a substrate batch of substrates is going to be processed, of which batch the substrates each obtained alignment marks M by a lithographic process done on third lithographic apparatus LM3. Third lithographic apparatus was the creator the alignment marks M.

Before starting a lithographic process on the second lithographic apparatus LM2, the (computer system CS2 of the) second lithographic apparatus LM2 messages the server fab host that a substrate batch is to be processed.

In step 710, the server Fab Host receives the message from the second lithographic apparatus LM2, including information on the substrate batch to be processed. This information can be made available in many ways, for example by an operator or by an identification tag on a substrate container holding the substrate batch, or from a processing schedule.

In step 720, the server Fab Host identifies the batch (either from the message from second lithographic apparatus LM2 or from other information on the fab host, for example, the processing schedule).

In step 730, the server Fab Host retrieves from a database, preferably the database APC, on which lithographic apparatus the alignment marks M were produced (here: third lithographic apparatus LM3).

In step 740, the server Fab Host fetches from the database APC the data for statistical correlation O32 for providing overlay corrections between second lithographic apparatus LM2 and third lithographic apparatus LM3, with the third lithographic apparatus LM3 being used as creator of the alignment marks M.

In step 750, the server Fab Host sends to the second lithographic apparatus LM2 process control data including the data for statistical correlation O32. Possibly, the fab host also sends other process control data to the second lithographic apparatus if needed.

In step 760 the procedure ends.

The computer system CS2 of the second lithographic apparatus LM2 receives the data of statistical correlation 032 for providing corrections of machine-to-machine differences between the second lithographic apparatus LM2 and the third lithographic apparatus LM3 and uses the data for statistical correlation 032 to compute corrected settings for position and orientation of the substrate table WT of the second lithographic apparatus LM2. The corrected settings are then used to adapt the position and orientation of the substrate table WT of the second lithographic apparatus LM2, in such a way that the machine-to-machine differences between the second lithographic apparatus LM2 and the third lithographic apparatus LM3 are minimized and an optimal overlay can be achieved.

It is noted that instead of sending statistical correlation data to the requesting second lithographic apparatus LM2, the server fab host may be arranged for computing correction data directly from the data for statistical correlation O32 and may send the correction data to the requesting second lithographic apparatus LM2. Possibly, the correction data may even be applied immediately for correction of the settings of the second lithographic apparatus LM2 without any need for computation of settings by the computer system CS2 of the second lithographic apparatus LM2.

According to embodiments of the present invention, a method is provided that advantageously takes into account alignment and overlay differences between lithographic apparatus. The method can be executed on-line: i.e., the alignment and overlay differences may be determined within the lithographic apparatus during the normal optical alignment procedure of a substrate preceding an exposure run. Off-line time can effectively be reduced.

Moreover, the method according to embodiments of the present invention advantageously provides a possibility to increase the accuracy in determining overlay errors by application of statistical data which are collected during production runs on each of the lithographic apparatus in the wafer fab.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A method for aligning a substrate in a first lithographic apparatus, the substrate comprising a plurality of alignment marks that have been defined by a second lithographic apparatus and are arranged to define a substrate grid to form a coordinate system on the substrate the method comprising:
   measuring alignment mark data of the plurality of alignment marks,
   determining the substrate grid of the substrate from the measured alignment data by using a first grid model described with a first set of parameters
   determining the substrate grid of the substrate from the alignment using a second grid model described with a second set of parameters, the second set comprising the first set of parameters and at least one parameter corresponding to a machine-to-machine difference between the first and the second lithographic apparatus, and
   correcting machine-to-machine differences with automatic process control data based on the at least one parameter.

2. The method of claim 1, further comprising calculating statistical correlation data from providing overlay corrections between the first and the second lithographic apparatus from the at-least one parameter, said statistical correlation data being used as automated process control data.

3. The method of claim 1 wherein the first substrate grid model is a four parameter model and the second substrate grid is a five or six parameter model.

4. The method of claim 3 wherein the four parameter model includes translation in a first direction, translation in a second direction, perpendicular to the first direction, rotation around a reference axis of the coordinate system and overall scaling as parameters.

5. A lithographic apparatus comprising
   (a) a substrate table constructed to hold a substrate, the substrate comprising a plurality of alignment marks that have been defined by a second lithographic apparatus and are arranged to define a substrate grid to form a coordinate system on the substrate,
   (b) an alignment system configured to align the substrate with the substrate grid,
   (c) a computer system configured to
      (i) measure alignment mark data of the plurality of alignment marks,
      (ii) determine the substrate grid of the substrate from the measured alignment data by using a first grid model described with a first set of parameters
      (iii) determine the substrate grid of the substrate from the alignment using a second grid model described with a second set of parameters, the second set comprising the first set of parameters and at least one parameter corresponding to a machine-to-machine difference between the first and the second lithographic apparatus and
      (iv) correct machine-to-machine differences with automatic process control data based on the at least one parameter.

6. The lithographic apparatus of claim 5 wherein the first substrate grid model is a four parameter model and the second substrate grid is a five or six parameter model.

7. The lithographic apparatus of claim 6 wherein the four parameter model includes translation in a first direction, translation in a second direction, perpendicular to the first direction, rotation around a reference axis of the coordinate system and overall scaling as parameters.

8. A computer system of a first lithographic apparatus, the lithographic apparatus being arranged to align a substrate, the substrate comprising a plurality of alignment marks that have been defined by a second lithographic apparatus and are arranged to define a substrate grid to form a coordinate system on the substrate, the computer system comprising
a processing unit and memory, the memory being connected to the processing unit,
wherein said computer system is configured to
 (i) measure alignment mark data of the plurality of alignment marks,
 (ii) determine the substrate grid of the substrate from the measured alignment data by using a first grid model described with a first set of parameters
 (iii) determine the substrate grid of the substrate from the alignment using a second grid model described with a second set of parameters, the second set comprising the first set of parameters and at least one parameter corresponding to a machine-to-machine difference between the first and the second lithographic apparatus and
 (iv) correct machine-to-machine differences with automatic process control data based on the at least one parameter.

9. A device manufacturing method comprising
 (a) transferring a pattern from a patterning device onto a substrate disposed in a first lithographic apparatus,
 (b) aligning the substrate in a first lithographic apparatus, the substrate comprising a plurality of alignment marks that have been defined by a second lithographic apparatus and are arranged to define a substrate grid to form a coordinate system on the substrate the method comprising:
 (i) measuring alignment mark data of the plurality of alignment marks,
 (ii) determining the substrate grid of the substrate from the measured alignment data by using a first grid model described with a first set of parameters
 (iii) determining the substrate grid of the substrate from the alignment using a second grid model described with a second set of parameters, the second set comprising the first set of parameters and at least one parameter corresponding to a machine-to-machine difference between the first and the second lithographic apparatus, and
 (iv) correcting machine-to-machine differences with automatic process control data based on the at least one parameter.

10. An automated process control system comprising:
a server comprising a fab host computer system,
a first lithographic apparatus and a second lithographic apparatus, each of the first and the second apparatus comprising a computer system,
wherein each the computer system of the first lithographic system, the computer system of the second lithographic system and the fab host computer system comprise a processing unit and a memory, the memory being connected to the processing unit;
wherein the fab host computer system is connected to the computer system of the first lithographic system and the computer system of the second lithographic system and wherein the automated process control system is configured to align a substrate in the first lithographic apparatus in accordance with a method comprising
 (i) measuring alignment mark data of the plurality of alignment marks,
 (ii) determining the substrate grid of the substrate from the measured alignment data by using a first grid model described with a first set of parameters
 (iii) determining the substrate grid of the substrate from the alignment using a second grid model described with a second set of parameters, the second set comprising the first set of parameters and at least one parameter corresponding to a machine-to-machine difference between the first and the second lithographic apparatus, and
 (iv) correcting machine-to-machine differences with automatic process control data based on the at least one parameter.

* * * * *